United States Patent
Zhang

(10) Patent No.: US 12,405,530 B2
(45) Date of Patent: Sep. 2, 2025

(54) PHOTORESIST AND DISPLAY DEVICE

(71) Applicant: SUZHOU CHINA STAR OPTOELECTRONICS TECHNOLOGY CO., LTD., Jiangsu (CN)

(72) Inventor: Zhiwei Zhang, Jiangsu (CN)

(73) Assignee: SUZHOU CHINA STAR OPTOELECTRONICS TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/754,974

(22) PCT Filed: Apr. 12, 2022

(86) PCT No.: PCT/CN2022/086331
§ 371 (c)(1),
(2) Date: Apr. 18, 2022

(87) PCT Pub. No.: WO2023/184568
PCT Pub. Date: Oct. 5, 2023

(65) Prior Publication Data
US 2024/0168376 A1    May 23, 2024

(30) Foreign Application Priority Data
Mar. 30, 2022    (CN) .......................... 202210328737.0

(51) Int. Cl.
*G03F 7/004* (2006.01)
*G02B 1/04* (2006.01)
*G02F 1/1335* (2006.01)
*G03F 7/00* (2006.01)

(52) U.S. Cl.
CPC ............. *G03F 7/0045* (2013.01); *G02B 1/04* (2013.01); *G03F 7/0007* (2013.01); *G02F 1/133514* (2013.01)

(58) Field of Classification Search
CPC ....... G03F 7/0007; G03F 7/0045; G02B 1/04; G02F 1/133514
See application file for complete search history.

(56) References Cited

U.S. PATENT DOCUMENTS

2010/0248096 A1* 9/2010 Oota .................... C07D 207/34
430/7

FOREIGN PATENT DOCUMENTS

| CN | 102162994 A | 8/2011 | |
| CN | 110874013 A | 3/2020 | |
| CN | 111208664 A | 5/2020 | |
| CN | 111344360 A | 6/2020 | |
| JP | 2000044822 A | 2/2000 | |
| JP | 2008083416 A | 4/2008 | |
| JP | 2019091033 A * | 6/2019 | ............... C08F 2/44 |
| KR | 20110096442 A | 8/2011 | |

OTHER PUBLICATIONS

International Search Report in International application No. PCT/CN2022/086331, mailed on Nov. 29, 2022.
Written Opinion of the International Search Authority in International application No. PCT/CN2022/086331, mailed on Nov. 29, 2022.

* cited by examiner

*Primary Examiner* — Bijan Ahvazi

(57) ABSTRACT

A photoresist and a display device are provided. A colorant of the photoresist includes a blue pigment and a purple dye having an electron withdrawing group. The electron withdrawing group promotes electron transitions, causing blue shifts in materials. Under a condition without changing a backlight spectrum having low blue light, it can prevent blue light from hurting user's retina, thereby satisfying a need of anti-blue light. Problems of low the color gamut and low transmittance in current technology can also be prevented.

18 Claims, No Drawings

PHOTORESIST AND DISPLAY DEVICE

FIELD OF INVENTION

The present disclosure relates to the field of display technologies, and more particularly, to a photoresist and a display device.

BACKGROUND OF INVENTION

Studies have shown that blue light in a wavelength range of 415 nm to 455 nm has the greatest risk of phototoxicity to epithelial cells on retinal pigments, while blue light in a range of 455 nm to 500 nm has the lowest risk of phototoxicity to eye health. Eyesafe displays' display standards are the most comprehensive low-blue light health and safety requirements available today. A series of new requirements are placed on global consumer electronics and display industries, while guidance is also provided for high-intensity users of information technology in public sectors, enterprises, and education.

For eyesafe certification, current thin film transistor liquid crystal display (TFT-LCD) manufacturers mainly adjust backlight spectrums to meet customers' needs. Generally, the following two points need to be done: 1. a ratio of blue light needs to be less than 20%, and a peak value of the blue light needs to be less than 2 times of a peak value of green light. 2. A ratio of harmful blue light in the blue light needs to be less than 50% (that is, 415 nm~455 nm/400 nm~500 nm<50%). The industries refer to this backlight design as low blue light backlights.

Technical problem: a current mainstream low blue light backlight design in the industries is to shift a blue main peak wavelength to the right of 455 nm on the basis of the YAG standard to prevent blue light from hurting the retina. Under a condition of liquid crystal panels having a same spectrum, after using low blue light backlights, white points Wx and Wy are yellowish, a transmittance WY is low, and the SRGB-1931 the color gamut is also low.

Under the premise of using low blue light, TFT-LCD manufacturers generally increase thicknesses of RGB films or use a better low blue light backlights (such as KSF backlights or quantum dot (QD) backlights) to improve the color gamut. However, increasing the thicknesses of RGB films will reduce the transmittance, and using the better low blue light backlights (such as the KSF or QD backlights) will increase the cost of backlights, thereby reducing competitive advantages of entire products.

SUMMARY OF INVENTION

An objective of the present disclosure is to provide a photoresist and a color filter to solve problems of low the color gamut and low transmittance when using low blue light backlights to satisfy eyesafe standards in current technology.

In order to solve the above problems, the present disclosure provides a photoresist, which includes: a colorant including a blue pigment and a purple dye; wherein, the purple dye includes one of a first compound or a second compound; a structural formula of the first compound is

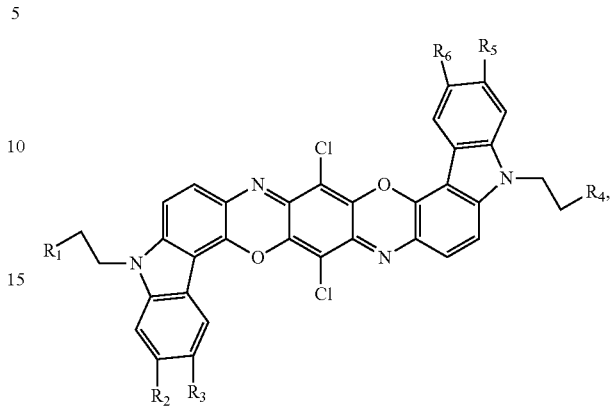

wherein, an $R_1$ group, an $R_2$ group, an $R_3$ group, an $R_4$ group, an $R_5$ group, and an $R_6$ group are electron withdrawing groups; and a structural formula of the second compound is

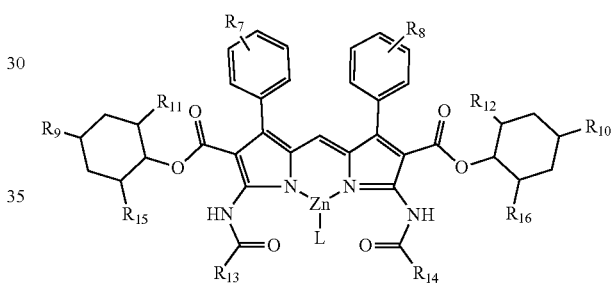

wherein, an $R_7$ group, an $R_8$ group, an $R_9$ group, an $R_{10}$ group, an $R_{11}$ group, an $R_{12}$ group, an $R_{13}$ group, an $R_{14}$ group, an $R_{15}$ group, and an $R_{16}$ group are the electron withdrawing groups, and an L group is a ligand.

Further, the ligand is selected from a halogen ion, a nitrogen-containing organic ligand, or an oxygen-containing organic ligand.

Further, the electron withdrawing groups include one or more of —OH, —OCH$_3$, —OCH═CH$_2$, —OCH$_2$CH$_3$, —COOH, —COOY, or —C═O, and Y in the —COOY is an alkyl group having 1 to 5 carbon atoms.

Further, the $R_1$ group and the $R_4$ group are same, the $R_2$ group and the $R_5$ group are same, the $R_3$ group and the $R_6$ group are same, the $R_7$ group and the $R_8$ group are same, the $R_9$ group and the $R_{10}$ group are same, the $R_{11}$ group and the $R_{12}$ group are same, the $R_{13}$ group and the $R_{14}$ group are same, and the $R_{15}$ group and the $R_{16}$ group are same.

Further, the blue pigment is copper phthalocyanine.

Further, a mass percentage of the colorant in the photoresist ranges from 2% to 30%.

Further, by mass percentage, a ratio of the blue pigment to the purple dye in the colorant ranges from 5:1 to 10:1.

Further, the colorant further includes a blue light absorber having a structural formula of

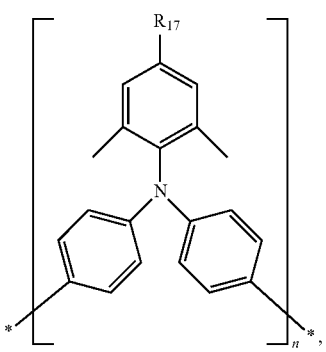

wherein, $R_{17}$ includes one of an alkoxy group, an ester group, a non-conjugated linear alkane, a branched alkane, a linear alkoxy group, or a heterocyclic compound, and $1000 \geq n \geq 10$.

Further, by mass percentage, a ratio of the blue pigment to the purple dye to the blue light absorber in the colorant ranges from 5:1:0.01 to 10:1:0.25.

Further, by mass percentage, the photoresist further includes: 2% to 30% of a resin; 1% to 10% of a monomer; 0.1% to 10% of an initiator; 0.1% to 1% of an additive; and 50% to 80% of a solvent.

In order to solve the above problems, the present disclosure further provides a display device. The display device includes a color filter having a plurality of blue color resists, and the blue color resists are formed using the photoresist of the present disclosure.

Beneficial effect: the colorant of the photoresist of the present disclosure includes the blue pigment and the purple dye having the electron withdrawing groups. The electron withdrawing groups promote electron transitions, causing blue shifts in materials. Under a condition without changing a backlight spectrum having low blue light, it can prevent blue light from hurting user's retina, thereby satisfying a need of anti-blue light. Problems of low the color gamut and low transmittance in current technology can also be prevented. The colorant of the photoresist of the present disclosure also includes the blue light absorber. Strong absorptivity of the blue light absorber to blue wavelength bands can improve the problem of low transmittance in current technology.

DETAILED DESCRIPTION OF PREFERRED EMBODIMENTS

The preferred embodiments of the present disclosure are described in detail below. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

Embodiment 1

This embodiment provides a display device. The display device includes a color filter. The color filter includes a plurality of blue color resists. The blue color resists are formed using a photoresist.

Wherein, the photoresist includes by mass percentage: 2% to 30% of a colorant, 2% to 30% of a resin, 1% to 10% of a monomer, 0.1% to 10% of an initiator, 0.1% to 1% of an additive, and 50% to 80% of a solvent.

Wherein, the colorant includes a blue pigment and a purple dye.

In this embodiment, the blue pigment is copper phthalocyanine.

In this embodiment, the purple dye is a first compound, and a structural formula of the first compound is

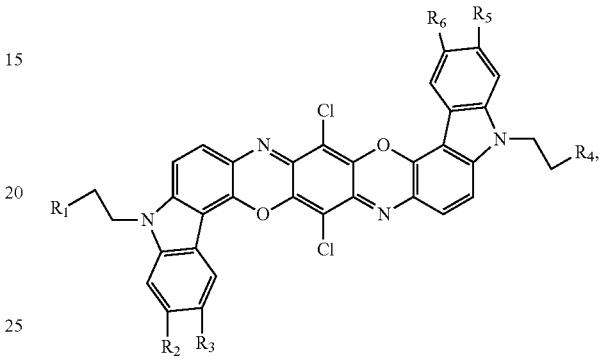

wherein an $R_1$ group, an $R_2$ group, an $R_3$ group, an $R_4$ group, an $R_5$ group, and an $R_6$ group are electron withdrawing groups.

Wherein, the electron withdrawing groups include one or more of —OH, —OCH$_3$, —OCH=CH$_2$, —OCH$_2$CH$_3$, —COOH, —COOY, or —C=O, and Y in the —COOY is an alkyl group having 1 to 5 carbon atoms.

The electron withdrawing groups can promote electron transitions, causing blue shifts in materials. Under a condition without changing a backlight spectrum having low blue light, it can prevent blue light from hurting user's retina, thereby satisfying a need of anti-blue light. Problems of low the color gamut and low transmittance in current technology can also be prevented.

In this embodiment, the $R_1$ group and the $R_4$ group are same, the $R_2$ group and the $R_5$ group are same, and the $R_3$ group and the $R_6$ group are same. In other embodiments, the $R_1$ group and the $R_4$ group may be different, the $R_2$ group and the $R_5$ group may be different, and the $R_3$ group and the $R_6$ group may be different.

Wherein, by mass percentage, a ratio of the blue pigment to the purple dye in the colorant ranges from 5:1 to 10:1.

Wherein, the resin may be a polyacrylic resin.

A main function of the initiator is to form free radicals or ionic active groups when exposed to light to initiate polymerization and crosslinking. Generally, acetophenone derivatives, diimidazole derivatives, alkyl aryl ketones, or ketoxime esters (OXE-1) may be used as the initiator.

The additive may include leveling agents or polyester dispersants. The solvent may include ethyl 3-ethoxypropionate (EEP), n-butylamine (MBA), 4-hydroxy-4-methyl-2-pentanone (DAA), propylene glycol methyl ether (PGME), or propylene glycol methyl ether acetate (PGMEA).

In this embodiment, 22.3% of the colorant, 6% of the resin, 5% of the monomer, 0.5% of the initiator, 0.2% of the additive, and 66% of the solvent are used.

In this embodiment, the blue pigment of the colorant is copper phthalocyanine, and the purple dye is the first compound. The structural formula of the first compound is

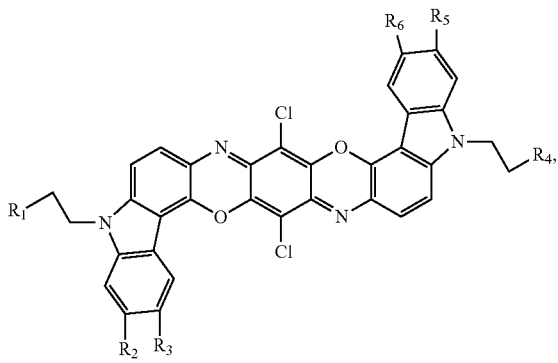

wherein, the $R_1$ group and the $R_4$ group are both —$OCH_3$, the $R_2$ group and the $R_5$ group are both —$OCH_2CH_3$, and the $R_3$ group and the $R_6$ group are both —COOH. A mass percentage of copper phthalocyanine to the first compound is 5:1. The resin is a polyacrylic resin, the monomer is polyhydric alcohol acrylate, the initiator includes alkyl aryl ketones and ketoxime esters (OXE-1), and the additive is a polyester dispersant. The solvent includes PGMEA and MBA, and a mass percentage of PGMEA to MBA is 9:1.

In conjunction with the following table, the color gamut (NTSC-1931, SRGB-1931) of this embodiment is significantly improved compared to the color gamut of the comparative example, and the transmittance (WY) of this embodiment is also relatively close to that of the comparative example.

| film thickness of RGB | BLU | Wx | Wy | WY | NTSC-1931 | SRGB-1931 |
|---|---|---|---|---|---|---|
| comparative example (2.4 μm/2.4 μm/2.6 μm) | low blue light backlight | 0.307 | 0.319 | 4.10% | 73.6% | 97.3% |
| example 1(2.78 μm/2.78 μm/2.68 μm) | low blue light backlight | 0.307 | 0.319 | 3.88% | 74.2% | 99.0% |

The composition of the photoresist for preparing the blue color resists in the comparative example is basically the same as that of the photoresist in example 1. A difference is that the structural formula of the purple dye in the colorant of the comparative example is

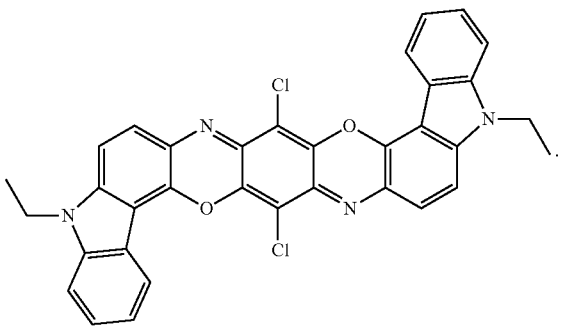 [SMILES: CCn1c2ccccc2c2c3c(ccc21)N=c1c(Cl)c2c(c(Cl)c1O3)=Nc1ccc3c(c1O2)c1ccccc1n3CC]

This embodiment uses the electron withdrawing groups to promote electron transitions, causing blue shifts in the materials. Under the condition without changing the backlight spectrum having low blue light, it can prevent blue light from hurting user's retina, thereby satisfying the need of anti-blue light. Meanwhile, the problems of low the color gamut and low transmittance in current technology can also be prevented.

Embodiment 2

This embodiment provides a display device. The display device includes a color filter. The color filter includes a plurality of blue color resists. The blue color resists are formed using a photoresist.

Wherein, the photoresist includes by mass percentage: 2% to 30% of a colorant, 2% to 30% of a resin, 1% to 10% of a monomer, 0.1% to 10% of an initiator, 0.1% to 1% of an additive, and 50% to 80% of a solvent.

Wherein, the colorant includes a blue pigment and a purple dye.

In this embodiment, the blue pigment is copper phthalocyanine.

In this embodiment, the purple dye is a second compound, and a structural formula of the second compound is

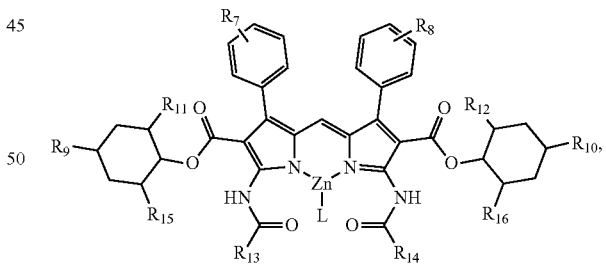

wherein an $R_7$ group, an $R_8$ group, an $R_9$ group, an $R_{10}$ group, an $R_{11}$ group, an $R_{12}$ group, an $R_{13}$ group, an $R_{14}$ group, an $R_{15}$ group, and an $R_{16}$ group are electron withdrawing groups, and an L group is a ligand.

Wherein, the ligand is selected from a halogen ion, a nitrogen-containing organic ligand, or an oxygen-containing organic ligand.

Wherein, the electron withdrawing groups include one or more of —OH, —$OCH_3$, —OCH=$CH_2$, —$OCH_2CH_3$, —COOH, —COOY, or —C=O, and Y in the —COOY is an alkyl group having 1 to 5 carbon atoms.

The electron withdrawing groups can promote electron transitions, causing blue shifts in the materials. Under the condition without changing the backlight spectrum having low blue light, it can prevent blue light from hurting user's retina, thereby satisfying the need of anti-blue light. Meanwhile, the problems of low the color gamut and low transmittance in current technology can also be prevented.

In this embodiment, the $R_7$ group and the $R_8$ group same, the $R_9$ group and the $R_{10}$ group are same, the $R_{11}$ group and the $R_{12}$ group are same, the $R_{13}$ group and the $R_{14}$ group are same, and the $R_{15}$ group and the $R_{16}$ group are same. In other embodiments, the $R_7$ group and the $R_8$ group may be different, the $R_9$ group and the $R_{10}$ group may be different, the $R_{11}$ group and the $R_{12}$ group may be different, the $R_{13}$ group and the $R_{14}$ group may be different, and the $R_{15}$ group and the $R_{16}$ group may be different.

Wherein, by mass percentage, a ratio of the blue pigment to the purple dye in the colorant ranges from 5:1 to 10:1.

Wherein, the resin may be a polyacrylic resin.

A main function of the initiator is to form free radicals or ionic active groups when exposed to light to initiate polymerization and crosslinking. Generally, acetophenone derivatives, diimidazole derivatives, alkyl aryl ketones, or ketoxime esters (OXE-1) may be used as the initiator.

The additive may include leveling agents or polyester dispersants. The solvent may include ethyl 3-ethoxypropionate (EEP), n-butylamine (MBA), 4-hydroxy-4-methyl-2-pentanone (DAA), propylene glycol methyl ether (PGME), or propylene glycol methyl ether acetate (PGMEA).

In this embodiment, 18% of the colorant, 6% of the resin, 5% of the monomer, 0.5% of the initiator, 0.2% of the additive, and 70.3% of the solvent are used.

In this embodiment, the blue pigment of the colorant is copper phthalocyanine, and the purple dye is the second compound. The structural formula of the second compound is

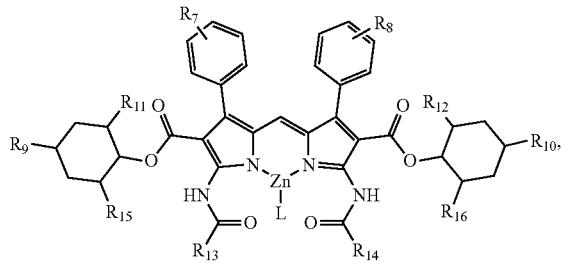

the $R_7$ group and the $R_8$ group are both —OH, the $R_9$ group and the $R_{10}$ group are both —OCH$_3$, the $R_{11}$ group and the $R_{12}$ group are both —OCH$_3$ (CH$_2$), the $R_{13}$ group and the $R_{14}$ group are both —COOH, the $R_{15}$ group and the $R_{16}$ group are both —OCH=CH$_2$, and the L group is a chloride ion. A mass percentage of copper phthalocyanine to the second compound is 8:1. The resin is a polyacrylic resin, the monomer is polyhydric alcohol acrylate, the initiator includes alkyl aryl ketones and ketoxime esters (OXE-1), and the additive is a polyester dispersant. The solvent includes PGMEA and MBA, and a mass percentage of PGMEA to MBA is 9:1.

In conjunction with the following table, the color gamut (NTSC-1931, SRGB-1931) of this embodiment is significantly improved compared to the color gamut of the comparative example, and the transmittance (WY) of this embodiment is closer to that of the comparative example.

| film thickness of RGB | BLU | Wx | Wy | WY | NTSC-1931 | SRGB-1931 |
|---|---|---|---|---|---|---|
| comparative example (2.4 μm/2.4 μm/2.6 μm) | low blue light backlight | 0.307 | 0.319 | 4.10% | 73.6% | 97.3% |
| example 2(2.55 μm/2.55 μm/2.75 μm) | low blue light backlight | 0.307 | 0.319 | 3.97% | 76.6% | 99.5% |

This embodiment uses the electron withdrawing groups to promote electron transitions, causing blue shifts in the materials. Under the condition without changing the backlight spectrum having low blue light, it can prevent blue light from hurting user's retina, thereby satisfying the need of anti-blue light. Meanwhile, the problems of low the color gamut and low transmittance in current technology can also be prevented.

Embodiment 3

This embodiment provides a display device. The display device includes a color filter. The color filter includes a plurality of blue color resists. The blue color resists are formed using a photoresist.

Wherein, the photoresist includes by mass percentage: 2% to 30% of a colorant, 2% to 30% of a resin, 1% to 10% of a monomer, 0.1% to 10% of an initiator, 0.1% to 1% of an additive, and 50% to 80% of a solvent.

Wherein, the colorant includes a blue pigment, a purple dye, and a blue light absorber.

In this embodiment, the blue pigment is copper phthalocyanine.

In this embodiment, the purple dye is a second compound, and a structural formula of the second compound is

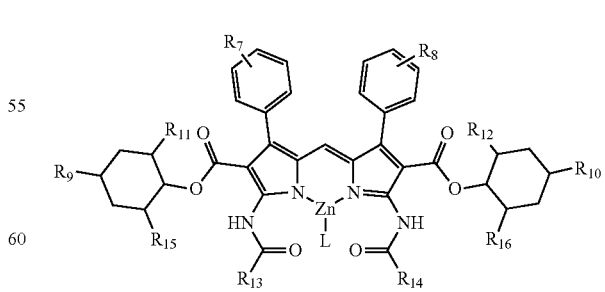

wherein an $R_7$ group, an $R_8$ group, an $R_9$ group, an $R_{10}$ group, an $R_{11}$ group, an $R_{12}$ group, an $R_{13}$ group, an $R_{14}$ group, an $R_{15}$ group, and an $R_{16}$ group are electron withdrawing groups, and an L group is a ligand.

Wherein, the ligand is selected from a halogen ion, a nitrogen-containing organic ligand, or an oxygen-containing organic ligand.

Wherein, the electron withdrawing groups include one or more of —OH, —OCH$_3$, —OCH═CH$_2$, —OCH$_2$CH$_3$, —COOH, —COOY, or —C═O, and Y in the —COOY is an alkyl group having 1 to 5 carbon atoms.

The electron withdrawing groups can promote electron transitions, causing blue shifts in materials, thereby allowing a blue light wavelength of the photoresist to range from 455 nm to 500 nm. It can prevent blue light from hurting user's retina, thereby satisfying the need of anti-blue light. Meanwhile, the problems of low the color gamut and low transmittance in current technology can also be prevented.

In this embodiment, the $R_7$ group and the $R_8$ group are same, the $R_9$ group and the $R_{10}$ group are same, the $R_{11}$ group and the $R_{12}$ group are same, the $R_{13}$ group and the $R_{14}$ group are same, and the $R_{15}$ group and the $R_{16}$ group are same. In other embodiments, the $R_7$ group and the $R_8$ group may be different, the $R_9$ group and the $R_{10}$ group may be different, the $R_{11}$ group and the $R_{12}$ group may be different, the $R_{13}$ group and the $R_{14}$ group may be different, and the $R_{15}$ group and the $R_{15}$ group may be different.

In this embodiment, the blue light absorber has a structural formula of

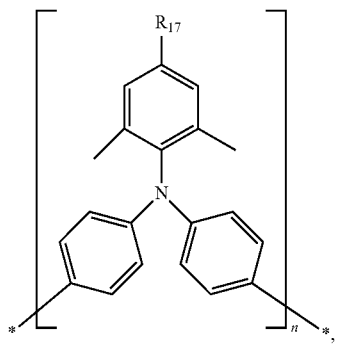

wherein $R_{17}$ includes one of an alkoxy group, an ester group, a non-conjugated linear alkane, a branched alkane, a linear alkoxy group, or a heterocyclic compound, and 1000≥n≥10. Strong absorptivity of the blue light absorber to blue wavelength bands can improve the problem of low transmittance in current technology.

Wherein, the heterocyclic compound may include a five-membered heterocyclic compound, which includes one of furan, thiophene, pyrrole, thiazole, or imidazole.

The heterocyclic compound may include a six-membered heterocyclic compound, which includes one of pyridine, pyrazine, pyrimidine, or pyridazine.

The heterocyclic compound may include a fused heterocyclic compound, which includes one of indole, quinoline, pteridine, or acridine.

Wherein, by mass percentage, a ratio of the blue pigment to the purple dye to the blue light absorber in the colorant ranges from 5:1:0.01 to 10:1:0.25.

Wherein, the resin may be a polyacrylic resin.

A main function of the initiator is to form free radicals or ionic active groups when exposed to light to initiate polymerization and crosslinking. Generally, acetophenone derivatives, diimidazole derivatives, alkyl aryl ketones, or ketoxime esters (OXE-1) may be used as the initiator.

The additive may include leveling agents or polyester dispersants. The solvent may include ethyl 3-ethoxypropionate (EEP), n-butylamine (MBA), 4-hydroxy-4-methyl-2-pentanone (DAA), propylene glycol methyl ether (PGME), or propylene glycol methyl ether acetate (PGMEA).

In this embodiment, 19.6% of the colorant, 6% of the resin, 5% of the monomer, 0.5% of the initiator, 0.2% of the additive, and 68.7% of the solvent are used.

In this embodiment, the blue pigment of the colorant is copper phthalocyanine, and the purple dye is the second compound. The structural formula of the second compound is

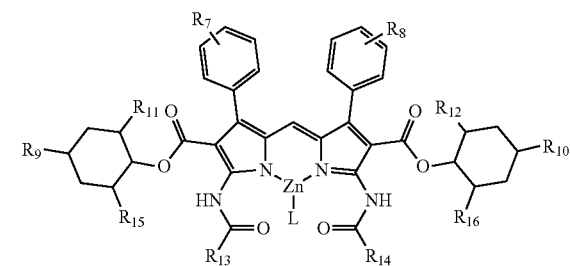

the $R_7$ group and the $R_8$ group are both —OH, the $R_9$ group and the $R_{10}$ group are both —OCH$_3$, the $R_{11}$ group and the $R_{12}$ group are both —OCH$_3$ (CH$_2$), the $R_{13}$ group and the $R_{14}$ group are both —COOH, the $R_{15}$ group and the $R_{16}$ group are both —OCH═CH$_2$, and the L group is a chloride ion. The structural formula of the blue light absorber is

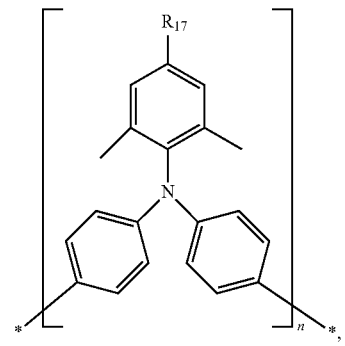

wherein $R_{17}$ is a methoxy group, and n is 100. The ratio of copper phthalocyanine to the second compound to the blue light absorber is 8:1:0.075. The resin is a polyacrylic resin, the monomer is polyhydric alcohol acrylate, the initiator includes alkyl aryl ketones and ketoxime esters (OXE-1), and the additive is a polyester dispersant. The solvent includes PGMEA and MBA, and a mass percentage of PGMEA to MBA is 9:1.

In conjunction with the following table, the color gamut (NTSC-1931, SRGB-1931) of this embodiment is significantly improved compared to the color gamut of the comparative example, example 1, and example 2, and the transmittance (WY) of this embodiment is also closer to that of the comparative example than example 1 and example 2. This embodiment uses the electron withdrawing groups to promote electron transitions, causing blue shifts in the materials. Under the condition without changing the backlight spectrum having low blue light, it can prevent blue light from hurting user's retina, thereby satisfying the need of anti-blue light. Meanwhile, the problems of low the color gamut and low transmittance in current technology can also be prevented.

| film thickness of RGB | BLU | Wx | Wy | WY | NTSC-1931 | SRGB-1931 |
|---|---|---|---|---|---|---|
| comparative example (2.4 μm/2.4 μm/2.6 μm) | low blue light backlight | 0.307 | 0.319 | 4.10% | 73.6% | 97.3% |
| example 3 (2.5 μm/2.5 μm/2.7 μm) | low blue light backlight | 0.307 | 0.322 | 4.04% | 77.8% | 99.7% |

The photoresist and the display device provided in the embodiments of the present disclosure is described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A photoresist, comprising:
a colorant comprising a blue pigment and a purple dye;
wherein the purple dye comprises one of a first compound or a second compound;
a structural formula of the first compound is

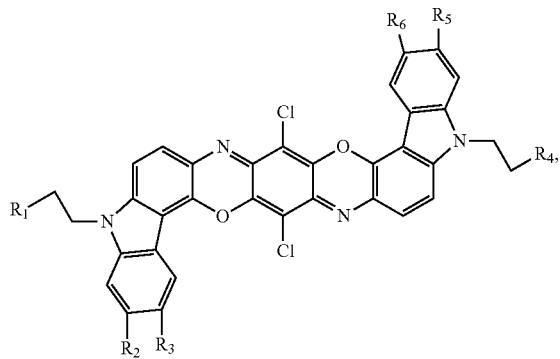

wherein $R_1$ group, $R_2$ group, $R_3$ group, $R_4$ group, $R_5$ group, and $R_6$ group are electron withdrawing groups; and
a structural formula of the second compound is

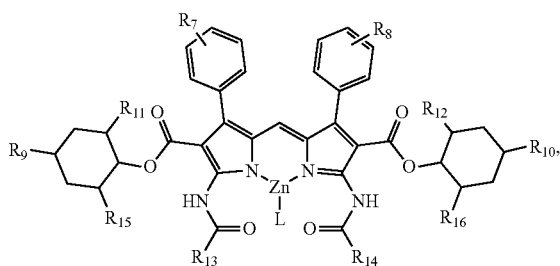

wherein $R_7$ group, $R_8$ group, $R_9$ group, $R_{10}$ group, $R_{11}$ group, $R_{12}$ group, $R_{13}$ group, $R_{14}$ group, $R_{15}$ group, and $R_{16}$ group are the electron withdrawing groups, and an L group is a ligand.

2. The photoresist according to claim 1, wherein the electron withdrawing groups comprise one or more of —OH, —OCH$_3$, —OCH=CH$_2$, —OCH$_2$CH$_3$, —COOH, —COOY, or —C=O, and Y in the —COOY is an alkyl group having 1 to 5 carbon atoms.

3. The photoresist according to claim 1, wherein the $R_1$ group and the $R_4$ group are same, the $R_2$ group and the $R_5$ group are same, the $R_3$ group and the $R_6$ group are same, the $R_7$ group and the $R_8$ group are same, the $R_9$ group and the $R_{10}$ group are same, the $R_{11}$ group and the $R_{12}$ group are same, the $R_{13}$ group and the $R_{14}$ group are same, and the $R_{15}$ group and the $R_{16}$ group are same.

4. The photoresist according to claim 1, wherein the blue pigment is copper phthalocyanine.

5. The photoresist according to claim 1, wherein a mass percentage of the colorant in the photoresist ranges from 2% to 30%.

6. The photoresist according to claim 1, wherein by mass percentage, a ratio of the blue pigment to the purple dye in the colorant ranges from 5:1 to 10:1.

7. The photoresist according to claim 1, wherein the colorant further comprises:
a blue light absorber having a structural formula of

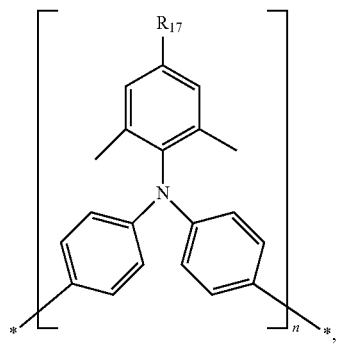

wherein $R_{17}$ comprises one of an alkoxy group, an ester group, a non-conjugated linear alkane, a branched alkane, a linear alkoxy group, or a heterocyclic compound, and 1000≥n≥10.

8. The photoresist according to claim 7, wherein by mass percentage, a ratio of the blue pigment to the purple dye to the blue light absorber in the colorant ranges from 5:1:0.01 to 10:1:0.25.

9. The photoresist according to claim 1, wherein by mass percentage, the photoresist further comprises:
2% to 30% of a resin;
1% to 10% of a monomer;
0.1% to 10% of an initiator;
0.1% to 1% of an additive; and
50% to 80% of a solvent.

10. A display device, comprising:
a color filter comprising a plurality of blue color resists, wherein a material of the blue color resists is a photoresist;
wherein the photoresist comprises:
a colorant comprising a blue pigment and a purple dye;
wherein the purple dye comprises one of a first compound or a second compound;
a structural formula of the first compound is

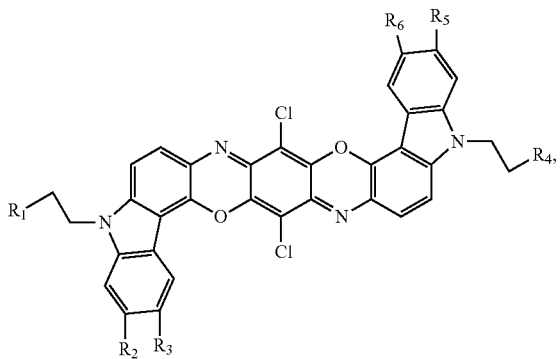

wherein $R_1$ group, $R_2$ group, $R_3$ group, $R_4$ group, $R_5$ group, and $R_6$ group are electron withdrawing groups; and
a structural formula of the second compound is

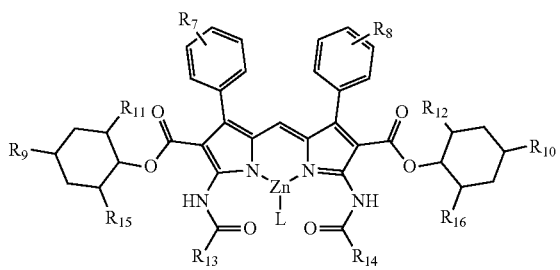

wherein $R_7$ group, $R_8$ group, $R_9$ group, $R_{10}$ group, $R_{11}$ group, $R_{12}$ group, $R_{13}$ group, $R_{14}$ group, $R_{15}$ group, and $R_{16}$ group are the electron withdrawing groups, and an L group is a ligand.

11. The display device according to claim 10, wherein the electron withdrawing groups comprise one or more of —OH, —OCH$_3$, —OCH=CH$_2$, —OCH$_2$CH$_3$, —COOH, —COOY, or —C=O, and Y in the —COOY is an alkyl group having 1 to 5 carbon atoms.

12. The display device according to claim 10, wherein the $R_1$ group and the $R_4$ group are same, the $R_2$ group and the $R_5$ group are same, the $R_3$ group and the $R_6$ group are same, the $R_7$ group and the $R_8$ group are same, the $R_9$ group and the $R_{10}$ group are same, the $R_{11}$ group and the $R_{12}$ group are same, the $R_{13}$ group and the $R_{14}$ group are same, and the $R_{15}$ group and the $R_{16}$ group are same.

13. The display device according to claim 10, wherein the blue pigment is copper phthalocyanine.

14. The display device according to claim 10, wherein a mass percentage of the colorant in the photoresist ranges from 2% to 30%.

15. The display device according to claim 10, wherein by mass percentage, a ratio of the blue pigment to the purple dye in the colorant ranges from 5:1 to 10:1.

16. The display device according to claim 10, wherein the colorant further comprises:
a blue light absorber having a structural formula of

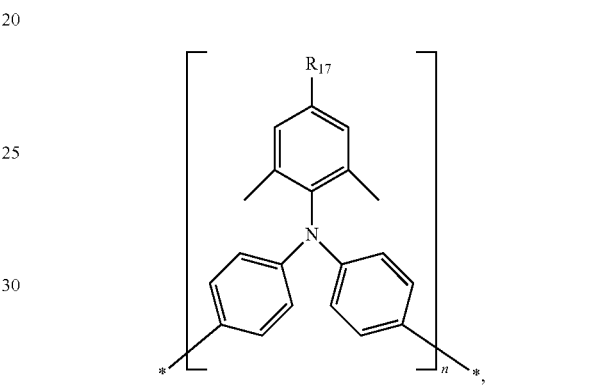

wherein $R_{17}$ comprises one of an alkoxy group, an ester group, a non-conjugated linear alkane, a branched alkane, a linear alkoxy group, or a heterocyclic compound, and $1000 \geq n \geq 10$.

17. The display device according to claim 16, wherein by mass percentage, a ratio of the blue pigment to the purple dye to the blue light absorber in the colorant ranges from 5:1:0.01 to 10:1:0.25.

18. The display device according to claim 10, wherein by mass percentage, the photoresist further comprises:
2% to 30% of a resin;
1% to 10% of a monomer;
0.1% to 10% of an initiator;
0.1% to 1% of an additive; and
50% to 80% of a solvent.

* * * * *